(12) United States Patent
Cui et al.

(10) Patent No.: US 8,940,194 B2
(45) Date of Patent: Jan. 27, 2015

(54) ELECTRODES WITH ELECTROSPUN FIBERS

(75) Inventors: Yi Cui, Stanford, CA (US); Hui Wu, Mountain View, CA (US); Liangbing Hu, Mountain View, CA (US)

(73) Assignee: The Board of Trustees of the Leland Stanford Junior University, Palo Alto, CA (US)

( * ) Notice: Subject to any disclaimer, the term of this patent is extended or adjusted under 35 U.S.C. 154(b) by 443 days.

(21) Appl. No.: 13/214,570

(22) Filed: Aug. 22, 2011

(65) Prior Publication Data

US 2012/0061124 A1 Mar. 15, 2012

Related U.S. Application Data

(60) Provisional application No. 61/375,493, filed on Aug. 20, 2010.

(51) Int. Cl.
| | | |
|---|---|---|
| *H01B 1/02* | (2006.01) | |
| *H01B 1/08* | (2006.01) | |
| *B82Y 20/00* | (2011.01) | |
| *B82Y 30/00* | (2011.01) | |
| *B82Y 40/00* | (2011.01) | |

(52) U.S. Cl.
CPC .............. *B82Y 30/00* (2013.01); *B82Y 20/00* (2013.01); *B82Y 40/00* (2013.01)
USPC ......... 252/512; 252/518.1; 428/593; 428/607

(58) Field of Classification Search
USPC ........... 252/512; 428/593, 605–608, 113, 338
See application file for complete search history.

(56) References Cited

U.S. PATENT DOCUMENTS

| | | |
|---|---|---|
| 5,380,703 A | 1/1995 | Kao et al. |
| 5,416,243 A | 5/1995 | Bekiarian et al. |
| 5,558,903 A | 9/1996 | Bhushan et al. |
| 6,386,468 B1 | 5/2002 | Neuberger et al. |
| 6,800,155 B2 | 10/2004 | Senecal et al. |
| 6,890,676 B2 | 5/2005 | Nuber et al. |
| 7,060,241 B2 | 6/2006 | Glatkoski |
| 7,109,136 B2 | 9/2006 | Senecal et al. |
| 7,122,106 B2 | 10/2006 | Lin et al. |

(Continued)

FOREIGN PATENT DOCUMENTS

WO   WO 2009/140381   11/2009

OTHER PUBLICATIONS

Teo et al. "A review of electrospinning design and nanofibre assemblies", Nanotechnology 17 (2006) R89-R106.*

(Continued)

*Primary Examiner* — Mark Kopec
(74) *Attorney, Agent, or Firm* — Crawford Maunu PLLC

(57) ABSTRACT

In accordance with various example embodiments, an apparatus includes two or more circuit nodes and a conductive material that is located between and configured to electrically couple the circuit nodes. The conductive material includes a network of elongated portions of at least one electrospun Cu-based nanostructure. Each elongated portion has an aspect ratio of at least 50,000 and a length that is greater than 100 microns, and at least one fused crossing point that joins with a fused crossing point of another of the elongated portions. The network of elongated portions is distributed and aligned in the conductive material to set a conductance level and a transparency level along the network, along at least one direction.

29 Claims, 9 Drawing Sheets

(56) References Cited

U.S. PATENT DOCUMENTS

| | | | |
|---|---|---|---|
| 7,122,710 | B2 | 10/2006 | Margrave et al. |
| 7,129,003 | B2 | 10/2006 | Cagle |
| 7,135,134 | B2 | 11/2006 | Tepper et al. |
| 7,261,852 | B2 | 8/2007 | Rinzler et al. |
| 7,531,157 | B2 | 5/2009 | Ford et al. |
| 7,535,462 | B2 | 5/2009 | Spath et al. |
| 7,604,757 | B2 | 10/2009 | Yasuda |
| 7,709,139 | B2 * | 5/2010 | White et al. ............ 429/127 |
| 8,414,961 | B1 * | 4/2013 | Robinson et al. ............ 427/74 |
| 2005/0048274 | A1 | 3/2005 | Rabolt et al. |
| 2006/0148978 | A1 | 7/2006 | Reneker et al. |
| 2006/0201390 | A1 | 9/2006 | Lahann et al. |
| 2007/0089845 | A1 | 4/2007 | Sotzing et al. |
| 2007/0113358 | A1 | 5/2007 | Rabolt et al. |
| 2007/0218281 | A1 | 9/2007 | Demir et al. |
| 2007/0284557 | A1 | 12/2007 | Gruner et al. |
| 2008/0113214 | A1 | 5/2008 | Davis et al. |
| 2008/0128631 | A1 | 6/2008 | Suhami |
| 2008/0129980 | A1 | 6/2008 | Dhawan et al. |
| 2008/0191606 | A1 | 8/2008 | Geohegan et al. |
| 2008/0213853 | A1 | 9/2008 | Garcia et al. |
| 2008/0237934 | A1 | 10/2008 | Reneker et al. |
| 2009/0020921 | A1 | 1/2009 | Cakmak et al. |
| 2009/0155460 | A1 | 6/2009 | Ruoff |
| 2009/0320911 | A1 | 12/2009 | Ruoff |
| 2010/0056007 | A1 | 3/2010 | Rabolt et al. |
| 2010/0285358 | A1 * | 11/2010 | Cui et al. ............ 429/218.1 |
| 2011/0227061 | A1 * | 9/2011 | Lee et al. ............ 257/43 |
| 2013/0316236 | A1 * | 11/2013 | Hackenberg et al. ............ 429/213 |

OTHER PUBLICATIONS

Wang et al. "Three-dimensional network films . . . ", Biosensors and Bioelectronics 25 (2009) 708-714.*

D. Li and Y.N. Xia, "*Fabrication of titania nanofibers by electrospinning,*" Nano Letters, vol. 3, pp. 555-560 (2003).

D. Li et al., "*Electrospinning Nanofibers as Uniaxially Aligned Arrays and Layer-by-Layer Stacked Films,*" Adanced Materials, vol. 16, No. 4, pp. 361-366 (Feb. 2004).

R. Kessick et al., "*The use of AC potentials in electrospraying and electrospinning processes,*" Polymer, vol. 45, pp. 2981-2984 (Feb. 2004).

A-M. Azad, "*Fabrication of transparent alumina ($Al_2O_3$) nanofibers by electrospinning,*" Materials Science and Engineering, vols. 435-436, pp. 468-476 (Jul. 2006).

M. Bognitzki et al., "*Preparation of sub-micrometer copper fibers via electrospinning,*" Advanced Materials, vol. 18, pp. 2384-2386 (2006).

H. Wu et al., "*Electrospinning of Fe, Co, and Ni nanofibers: Synthesis, assembly, and magnetic properties,*" Chemistry of Materials, vol. 19, pp. 3506-3511 (2007).

Y. Srivastava et al., "*Electrospinning of hollow and core/sheath nanofibers using a microfluidic manifold,*" Microfluid Nanofluid (Apr. 2007).

M.M. Munir et al., "*Optical and electrical properties of indium tin oxide nanofibers prepared by electrospinning,*" Nanotechnology, vol. 19, pp. 1-7 (Mar. 2008).

A. Velamakanni et al., "*Site-Specific Deposition of Au Nanoparticles in CNT Films by Chemical Bonding,*" American Chemical Society Nano, vol. 4, No. 1, pp. 540-546 (2010).

I.S. Kim et al., "*Fabrication of Metallized Electrospun Copper Nanofiber Webs,*" Materials Science Forum, vols. 638-642, pp. 1719-1724 (2010).

H. Wu et al., "*Electrospun Metal Nanofiber Webs as High-Performance Transparent Electrode,*" Nano Letters, vol. 10, No. 10, pp. 4242-4248 (Aug. 2010).

* cited by examiner

ELECTRODES WITH ELECTROSPUN FIBERS

RELATED DOCUMENTS

This patent document claims benefit under 35 U.S.C. §119 to U.S. Provisional Patent Application Ser. No. 61/375,493, entitled "Electrodes with Electrospun Fibers and Transparency Properties" and filed on Aug. 20, 2010; this patent document and the Appendix filed in the underlying provisional application, including the references cited therein, are fully incorporated herein by reference.

BACKGROUND

Transparent electrodes, useful for a variety of applications such as visual displays and solar cells, can be constructed using many different materials, and have often included indium tin oxide (ITO) films. Factors in the usefulness of such electrodes include cost considerations (e.g., the high price of indium), brittleness of films and the use of high vacuum deposition. Other transparent electrodes are constructed from solution-processed networks of nanostructures such as carbon nanotubes (CNTs), graphene, and silver. However, junction resistances between CNTs and boundry resistances between graphene nanostructures are relatively high. Moreover, the aspect ratios of silver nanowires are often less than ~100:1, and silver is relatively expensive.

Sheet resistance ($R_s$) and optical transmittance (T) are two parameters that are of interest for some applications of transparent electrodes. Different types of devices demand different levels of $R_s$ and T. For example, some high performance touch screens stringently require high T (>95%), but tolerate an $R_s$ of 400-600 Ohm/sq. For some solar cells and large area displays, $R_s$ may be set low enough, e.g., less than 20 Ohm/sq, to avoid undesired voltage drops and joule heating during device operation.

Indium tin oxide (ITO) has been widely used as a standard transparent electrode in various types of optoelectronic devices. Due to the constantly increasing demand of ITO for consumer electronics and the low abundance of indium (In), the price of ITO has continually increased throughout the past decade. In addition, the brittle nature of many ITO thin films frustrates their use in flexible applications.

Carbon nanotubes (CNT) and graphene can also be implemented in various applications. However, a sheet resistance of 100-1000 Ohm/sq at 80% optical transmittance in the visible range, achievable in many carbon-based materials, can be insufficient to suit various needs, such as in solar cells. Lithography steps can be difficult and costly to implement on a large scale. In solution processed silver nanowires, the lengths of the nanowires are typically less than 10 μm and the use of a polymer surfactant results in charge transport barriers which limit the conductivity.

These and other issues continue to present challenges to the manufacture and implementation of electrodes in applications using or benefitting from transparency characteristics.

SUMMARY

Aspects of the present disclosure relate generally to optically-transmitting electrodes, and in particular embodiments, to transparent electrodes constructed using elongated nanostructures.

Certain aspects of the present disclosure are exemplified in a number of illustrated implementations and applications, some of which are shown in the figures and characterized in the claims section that follows.

Various aspects of the present disclosure relate to the use of longer metal nanowires, which can be useful for improved performance. Particular embodiments of the present disclosure relate to transparent electrodes constructed using copper nanofiber networks and an electrospinning process. In certain embodiments of the present disclosure, these copper nanofibers have ultrahigh aspect ratios of up to 100,000:1. Various embodiments of the present disclosure are directed toward nanofibers having fused crossing points with ultra-low junction resistances. For instance, the nanowires can faun an electrode with low sheet resistance, e.g., 90% transmittance and 50 Ohm/sq. Certain copper nanofiber networks provide suitable flexibility and stretchability.

A particular embodiment of the present disclosure relates to the use of transparent electrodes for solar cells. For instance, organic solar cells using copper nanowire networks as transparent electrodes can provide a power efficiency of 3.0%. Networks as discussed herein can be connected across electrodes for light-collecting portions of the solar cells.

Another embodiment is directed to an apparatus having at least two circuit nodes and a conductive material that electrically couples the at least two circuit nodes. The conductive material includes a network of elongated portions of at least one electrospun Cu-based nanostructure for an article that provides conductive and transparent attributes. Each of the elongated portions has its conductive and transparent attributes being provided by an aspect ratio of at least 50,000 and a length that is greater than 100 microns, and at least one fused crossing point joining with a fused crossing point of another of the elongated portions. The network of elongated portions is distributed and aligned in the conductive material to set a conductance level and a transparency level along the network in at least one direction.

Another example embodiment is directed to a method for manufacturing an apparatus. A conductive material is formed between at least two circuit nodes, and the at least two circuit nodes are electrically coupled with the conductive material that has a network of elongated portions of at least one electrospun Cu-based nanostructure for an article that provides conductive and transparent attributes. These conductive and transparent attributes are set by forming the elongated portions with an aspect ratio of at least 50,000 and a length that is greater than 100 microns, and forming at least one fused crossing point joining with a fused crossing point of another of the elongated portions. The network of elongated portions is distributed and aligned in the conductive material to set a conductance level and a transparency level along the network in at least one direction.

Another example embodiment is directed to conductive sheet having a plurality of elongated portions and a plurality of fused crossing points. The elongated portions respectively have at least one electrospun Cu-based nanostructure, each elongated portion having an aspect ratio of at least 50,000 and a length that is greater than 100 microns. Each fused crossing point is connected to one of the elongated portions and joined with another one of the fused crossing points that is connected to another one of the elongated portions. The fused crossing points join the elongated portions in a sheet network extending in first and second directions, with the network having a transmittance of at least 90% and a sheet resistance of less than 50 Ohm/sq.

The above summary is not intended to describe each illustrated embodiment or every implementation of the present disclosure.

BRIEF DESCRIPTION OF THE DRAWINGS

Aspects of the present disclosure may be more completely understood in consideration of the detailed description of various embodiments of the present disclosure that follows in connection with the accompanying drawings, in which.

Figure 1A:
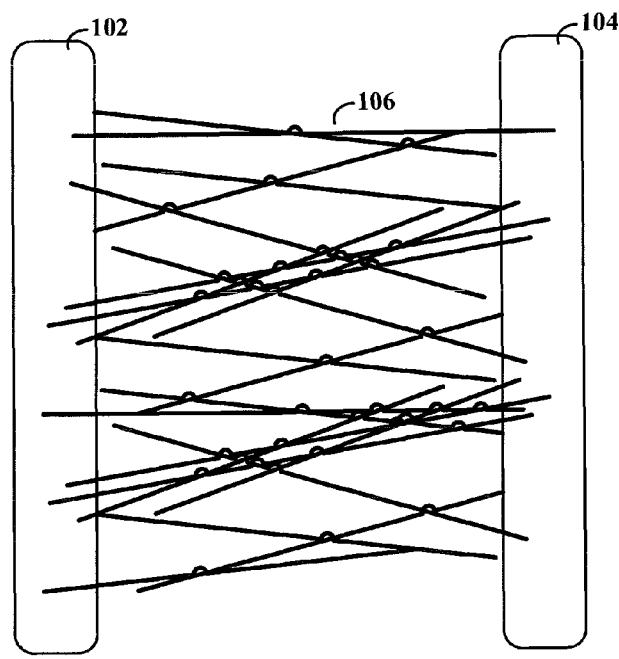
FIG. 1A depicts a photonic device with a metal-based network of nanofibers, consistent with an embodiment of the present disclosure.

While the present disclosure is amenable to various modifications and alternative forms, specifics thereof have been shown by way of example in the drawings and will be described in further detail. It should be understood, however, that the intention is not to limit the disclosure to the particular embodiments described. On the contrary, the intention is to cover all modifications, equivalents, and alternatives falling within the spirit and scope of the present disclosure.

DETAILED DESCRIPTION

The present disclosure is believed to be applicable to a variety of different types of devices and processes, and the present disclosure has been found to be particularly suited for optically-transmitting electrodes. While the present disclosure is not necessarily limited to such applications, various aspects of the present disclosure may be appreciated through a discussion of various examples using this context.

Embodiments of the present disclosure are directed toward a method of manufacturing a device and/or a device having an electrode with electrospun nanofibers that are configured to provide optical transmittance properties. In certain embodiments, the nanofibers can be metallic and more specifically, the nanofibers can be copper.

Consistent with an embodiment of the present disclosure, a photonic device includes at least two circuit nodes. A material is located between and configured to electrically couple said at least two circuit nodes. The material includes a network of elongated portions of at least one electrospun Cu-based nanostructure, the elongated portions characterized in that each portion has an aspect ratio of at least 50,000 and a length that is greater than 100 microns and at least one fused crossing point that joins with a fused crossing point of another of the elongated portions to set respective ultra-low-resistance junctions providing low Ohmic resistances. The network of elongated portions are distributed and aligned in the material to satisfy a specified conductance level and a specified transparency level along at least one direction thereof.

Various embodiments of the present disclosure relate to transparent and conductive Cu nanofiber mesh structures. The mesh can exhibit a number of different properties, some of which are provided by the aspect ratio of the Cu nanofibers. One such property relates to the transparency of the mesh structure. Another property is the sheet resistance of the mesh structure. Still other properties relate to the elasticity or flexibility of the material. Moreover, certain embodiments are directed toward maintaining the conductivity and transparency despite stretching or folding of the mesh structures.

An embodiment of the present disclosure is directed toward the creation of nanofiber mesh structures using a process sometimes referred to as electrospinning. An electrical field is applied to draw very fine (typically on the micro or nanoscale) fibers from a liquid fiber material (e.g., Cu-based material). The fibers can be applied to a substrate (e.g., glass). Additional steps can then be used to process the fibers. For instance, the liquid material can include polymer material designed to form nanofibers with desired properties. The liquid material can also include a metal material that is carried by or mixed with the polymer material. After formation of fibers, the polymer material can be removed (e.g., by heating), leaving nanofibers of the metal-based material. Processing can be performed to further alter the remaining metal-based material (e.g., as part of a redox reaction). The process can also serve to create coupling/bonds between the nanofibers themselves.

In some implementations, electrospun conductive polymer nanofibers are formed and coated with a metal or metals using an approach such as electrodeposition or metal evaporation. Metal electrodeposition can be used, for example, to coat the nanofibers on all sides. Metal evaporation can be used, for example, to coat less than all of the nanofibers, such as by coating one side (e.g., about half) of the nanofibers, or by coating about all of the nanofibers. The polymer material can be removed (e.g., as above) to leave the electrodeposited or evaporated metals behind.

In certain embodiments of the present disclosure, the process can be adjusted to produce a mesh structure with desired properties. For instance, the density and/or thickness of the mesh structure can be controlled during the application of the electric field. This can be useful for controlling the sheet resistance, optical transmittance, strength and/or flexibility of the mesh structure. The extent that nanofibers are coupled to one another can also be used to control properties such as the sheet resistance.

An embodiment of the present disclosure is directed toward a mesh structure that includes nanofibers that have a specific physical shape. For instance, one embodiment relates to the nanofibers that exhibit a trough shape. These nanowires can be formed, for example, by partially coating fibers formed from a polymer material. The polymer material can, optionally, be removed as desired.

Aspects of the present disclosure relate to the use of transparent metal electrodes in applications including, but not limited to, solar-power devices and touch screens.

Embodiments of the present disclosure relate to one or more metallic nanofibers continuously formed during an electrospinning process. A continuously formed nanofiber can include a plurality of segments that have lengths sufficient to provide desired conductance and/or transmittance. A segment can extend between one or more physical anchor points. The anchor points can include electrical nodes and/or other segments. Two contacting segments can, if desired, be fused (e.g., through heating). The spacing between and amongst segments and their anchor points can be controlled by varying the electrospinning process. Increasing the spacing can be useful for improved transmittance, although tradeoffs may exist in terms of conductance.

In one embodiment of the present disclosure, a set of segments are aligned to be used as part of an optical touch screen. The alignment of the segments can provide low-conductance between two electrodes. Moreover, the alignment can also be useful for polarization of light passing through the set of segments. The spacing, alignment and orientation of the set of segments can therefore be selected according to a desired response profile for the touch screen. For instance, orientation of a set of segments can provide relatively low impedance between a first set of circuit nodes and relatively high impedance between a second set of circuit nodes. Moreover, multiple sets of segments can be individually aligned, oriented and spaced.

In one embodiment, alternating sets of segments can be arranged across a touch screen. Each set of segments can be constructed with a respective set of properties. For instance, a set of multiple different segments could be aligned between two electrodes of a touch screen. Each set of segments can have different conductance and transmittance values, and can be arranged in a pseudo-random arrangement. This can be particularly useful for providing strips of highly-conductive touch screen sections between two electrodes. Other screen sections can include sets of segments with high-optical transmittance. The spacing between the highly-conductive sections can be sufficiently great to avoid perceptible effects. In this manner, the overall properties of the touch screen are a combination of different sets of segments.

Various embodiments of the present disclosure relate to the alignment of nanofiber segments in a manner that is designed to control the conductance between two circuit nodes. The conductance can be further controlled by the degree of fusing that occurs between different nanofiber segments.

Turning now to the figures, FIG. 1A depicts a photonic device with a metal-based network of nanofibers, consistent with an embodiment of the present disclosure. A network of nanofibers 106 is arranged between circuit nodes 102 and 104. The arrangement may, for example, be pseudo-random with different portions thereof being arranged to generally correspond to other portions, and the respective portions being arranged with random characteristics. Electrical signals or electrical power can be transmitted between the circuit nodes 102 and 104. Optical energy can pass through the network of nanofibers 106 to facilitate applications relating to visual displays, optical energy capture, optical communications or other purposes. The network of nanofibers 106 can be configured to satisfy various desired properties of the photonic device. For instance, one or more of the density of nanofibers, length, width, aspect ratio, orientation, material, shape, thickness and degree of fused junctions can be modified. These, and other, configuration parameters can be used to adjust or control properties, such as conductivity or sheet resistance, optical transmittance, flexibility, strength and weight.

According to one embodiment of the present disclosure, a photonic device includes a material with a network of elongated portions 106 of at least one electrospun Cu-based nanostructure. The network 106 is electrically and physically connected between two or more circuit nodes 102 and 104. The elongated portions have an aspect ratio of at least 50,000 and a length that is greater than 100 microns. The network 106 includes at least one fused crossing point that joins with a fused crossing point of another of the elongated portions to set respective ultra-low-resistance junctions, providing low Ohmic resistances. The network of elongated portions are distributed and aligned in the material to satisfy a specified conductance level and a specified transparency level along at least one direction thereof.

Particular embodiments of the present disclosure relate to the use of electrospinning to manufacture the network of nanofibers 106. The electrospinning process can be controlled to produce nanofibers of sufficient aspect ratio, alignment and size, among other things. The density of the nanofibers can also be adjusted as part of the electrospinning process. In a particular process, the liquid/solution source material for the electrospinning includes a polymer. The properties of the polymer material can be varied according to the desired nanofiber properties. The polymer properties can include, as non-limiting examples, the molecular weight and distribution and whether the polymer has a branched, linear or some other architecture. If the polymer is contained within a solution, properties of the solution, such as viscosity, conductivity and surface tension can also be adjusted. As the liquid source material leaves the source tip, a number of additional factors can affect the properties of the resulting network of nanofibers. For instance, the physical distance between the source tip and the substrate/collection point for the nanofibers can be controlled. It is also possible to control the electric potential, flow rate, temperature, air velocity and makeup and other factors. Relative motion between the source tip and the target substrate/collection point can also have a relative effect on the network of nanofibers.

A number of different electrospinning processes can be implemented including, but not limited to those discussed in Li, D. & Xia, Y. N. *Electrospinning of nanofibers: Reinventing the wheel?* Advanced Materials 16, 1151-1170 (2004); Bognitzki, M. et al. *Preparation of sub-micrometer copper fibers via electrospinning.* Advanced Materials 18, 2384-2386 (2006); Li, D. & Xia, Y. N. *Fabrication of titania nanofibers by electrospinning.* Nano Letters 3, 555-560 (2003); and Wu, H., Zhang, R., Liu, X. X., Lin, D. D. & Pan, W. *Electrospinning of Fe, Co, and Ni nanofibers: Synthesis, assembly, and magnetic properties.* Chemistry of Materials 19, 3506-3511 (2007), each of which is fully incorporated herein by reference.

In various embodiments, nanofibers such as shown in FIG. 1A are coated with a material to suit one or more applications. In one implementation, conductive nanofibers (e.g., including Cu, Au and/or Ag) are coated with a protection overcoating, such as ITO (indium-tin-oxide) or AZO (aluminum-zinc oxide).

Figure 1B:
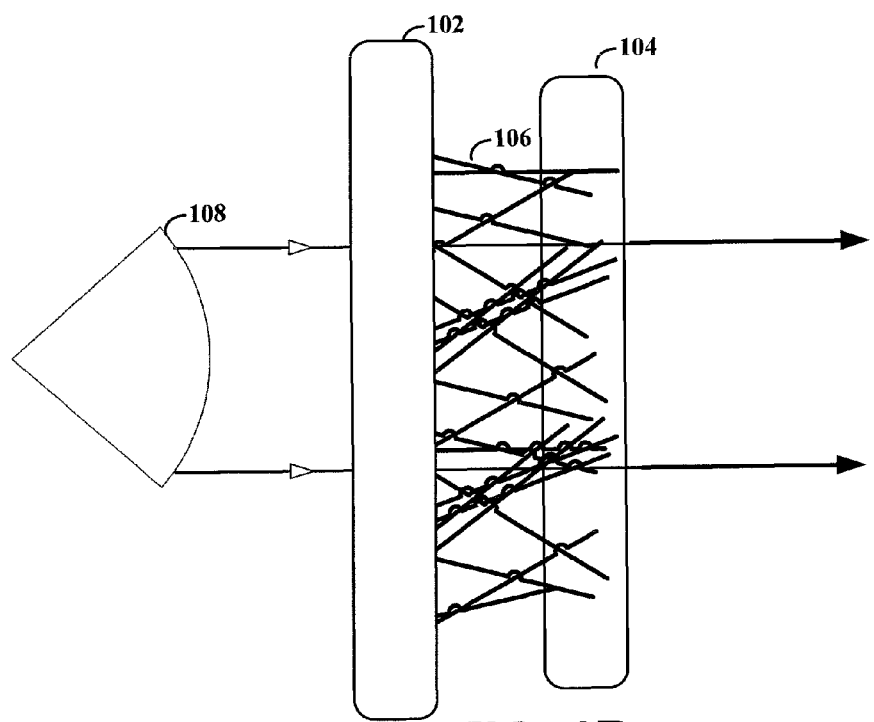
FIG. 1B depicts a rotated view of a photonic device with a metal-based network of nanofibers, consistent with an embodiment of the present disclosure.

FIG. 1B depicts a rotated view of a photonic device with a metal-based network of nanofibers, consistent with an embodiment of the present disclosure. Light source 108 is depicted to show the transmittance properties of the network of nanofibers 106 in a particular direction.

Circuit nodes 102 and 104 can be used for a variety of different purposes and functions. For instance, the circuit nodes 102 and 104 can be connected to sensors for determining when a person contacts the network of nanofibers 106. In this manner, the network of nanofibers 106 can be used with touch screens, capacitive and otherwise. As a non-limiting example, sensors can be used to detect capacitive changes that occur when a person touches, or nearly touches the network of nanofibers 106.

Consistent with another embodiment, the circuit nodes 102 and 104 can represent connections as part of a solar power conversion cell. As a non-limiting example, some organic solar cells operate using a transparent electrode that allows light to pass to an optically absorbent material (e.g., organic material). The absorption of the light causes electrons to be released and collected by the network of nanofibers 106. The electrical conductance and optical transmittance of the network of nanofibers 106 can have a significant impact on the efficiency of the solar cell. Moreover, organic solar cells can sometimes be used for their flexibility. Thus, the flexibility of the network of nanofibers 106 can also be a relevant factor.

Embodiments of the present disclosure relate to alignment of nanofibers along one or more directions. For instance, a set of nanofibers can be arranged predominantly parallel to one another between two support nodes. Such alignment of the nanofibers can be particularly useful for increasing the optical transmittance of the network of nanofibers. Moreover, the alignment can be beneficial in terms of sheet resistance (e.g., due to a reduced number of joints between two circuit nodes) and for providing desired polarization.

In another instance, one or more additional set(s) of nanofibers can be arranged predominantly parallel to one another but in a different direction relative to the original set of nanofibers. For instance, an additional set of nanofibers could be arranged substantially perpendicular to the original set of nanofibers.

Another embodiment of the present disclosure uses an electrospinning process to fabricate nanoscale continuous ultra-long fibers. This embodiment, along with experimental-type results, is discussed in more detail hereafter. The disclosure, however, is not limited by this discussion.

Figure 2:
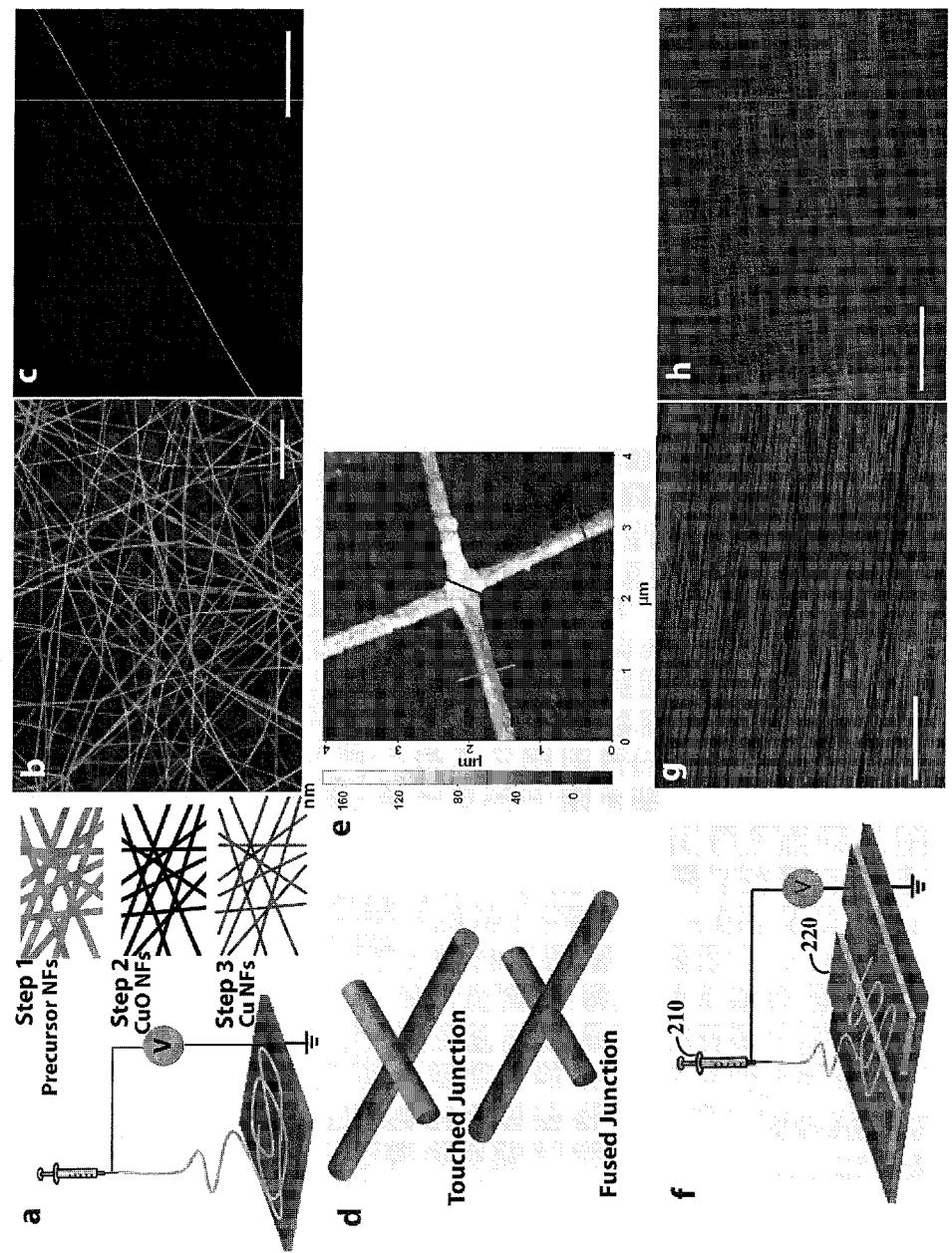
FIG. 2A depicts a schematic of an electro spinning setup and process, consistent with an embodiment of the present disclosure.
FIG. 2B presents a scanning electron microscopy (SEM) image of the synthesized Cu nanofiber networks with diameters of ~100 nm, consistent with an embodiment of the present disclosure.
FIG. 2C shows a 100 µm segment of a single continuous Cu nanofiber, consistent with an embodiment of the present disclosure.
FIG. 2D depicts a schematic of cross junctions of fused and touched junctions, consistent with an embodiment of the present disclosure.
FIG. 2E depicts the fused joint nature of cross junctions as confirmed by atomic force microscopy (AFM), consistent with an embodiment of the present disclosure.
FIG. 2F depicts a schematic for the use of two metal strips separated by a small distance (e.g., one centimeter) to produce a network of nanofibers, consistent with an embodiment of the present disclosure.
FIG. 2G shows an SEM image of Cu nanofiber arrays and patterns with a single set of nanofibers arranged in parallel, consistent with embodiments of the present disclosure.
FIG. 2H shows an SEM image of Cu nanofiber arrays and patterns with two sets of nanofibers arranged perpendicular to one another, consistent with embodiments of the present disclosure.

The electrospinning processes employs a strong electrical field to draw very fine (typically on the micro or nanoscale) fibers from a liquid source (in the schematic illustrated in the left column of FIG. 2A). This process can be particular useful for fabrication of continuous one-dimensional (1D) nanomaterials composed of polymers, oxides, carbon, and metals. The right column of FIG. 2A shows a fabrication process for producing a Cu nanofiber network. In Step 1, precursor nanofibers with copper acetate dissolved in polyvinyl acetate (PVA) are electrospun onto a glass substrate, with the fibers having diameters of around 200 nm. In Step 2, polymer nanofibers with copper precursors are heated at 500° C. in air for 2 hours in order to remove the polymer components and the nanofibers are transformed into dark brown CuO nanofibers. In Step 3, CuO nanofibers are reduced into red Cu nanofibers after annealing in an $H_2$ atmosphere at 300° C. for one hour.

FIG. 2B presents a scanning electron microscopy (SEM) image of synthesized Cu nanofiber networks with diameters of ~100 nm, consistent with an embodiment of the present disclosure. The Cu nanofibers are shown to have generally preserved the morphologies of the original polymer nanofibers. The average diameters of Cu nanofibers can be controlled within the range of 50-200 nm by adjusting electrospinning conditions such as the polymer solution viscosity and the spinning voltage. The area density of Cu nanofibers can be controlled via the electro spinning duration. The synthesized Cu nanofibers can be manufactured with a polycrystalline structure with little CuO on the surface, which may be evaluated via transmission electron microscopy (TEM), selected-area electron diffraction (SAED), energy-dispersive X-ray spectroscopy (EDS) and powder X-ray diffraction (XRD).

In some implementations, metal nanofibers are made by electrospinning as discussed herein to exhibit characteristics that can be used for applications involving transparent electrodes. For instance, a copper nanofiber can be made extremely long, as produced via electrospinning to form a continuous fiber to cover an entire surface, with few breaking points generated during processing. In some implementations, Cu nanofibers are formed as continuous nanofibers extending more than 1 cm with diameters of about 100 nm, resulting in aspect ratios above 100,000.

FIG. 2C shows a 100 μm segment of a single continuous Cu nanofiber, consistent with another embodiment of the present disclosure. The percolation theory for 1D sticks predicts that the percolation threshold, $N_c$, dramatically decreases as the length of the sticks increases:

$$l\sqrt{\pi N_c}=4.236 \tag{1}$$

With nanofiber lengths on the order of a centimeter, percolation density can be set at about $5.7\times10^{-8}/\mu m^2$.

The Cu nanofiber networks exhibiting ultra-low junction resistances as discussed herein can be formed using one or more of a variety of approaches. Without being bound by theory, these resistances can be set according to specific parameters of the nanofiber formation process. For instance, during the chemical transformation of polymer fibers to CuO nanofibers, thermal heating melts the polymer nanofibers, which merge the two fibers into the same identity at the cross junction point and remove any junction interface (as schematically shown in FIG. 2D). The soldered cross joints remain during the CuO to Cu transformation. SEM images of cross junctions between two Cu nanofibers can be used to detect the melting of cross junctions.

FIG. 2E depicts the fused joint nature of cross junctions, as confirmed by atomic force microscopy (AFM) and consistent with an embodiment of the present disclosure. The heights of the two single example fused Cu nanofibers are 120 nm and 90 nm, respectively, and the height of the cross junction is 125 nm, which is close to that of a single fiber and much lower than the sum of the heights of the two nanofibers (210 nm). In various implementations, at least 70% of the junctions in Cu nanofiber networks are melted together, with resulting melt junctions between Cu nanofibers exhibiting relatively low roughness, which reduces the probability of electrical shorting through devices that are fabricated on top of the electrode.

In various implementations, electrospinning is used to provide a facile process to align nanofibers to form regular arrays. This alignment can be used for controlling or reducing the network resistance and manipulating optical polarization. Percolation theory predicts that aligning objects, such as 1D nano structures, anisotropically can reduce the percolation threshold.

FIG. 2F depicts a schematic for the use of two metal strips separated by a small distance (e.g., one centimeter) to produce a network of nanofibers, consistent with an embodiment of the present disclosure. A voltage is applied to a source 210 to form electrospun nanofibers on a surface 220. This approach can be particularly useful for generating large scale Cu nanofiber arrays with uniform orientations and grid patterns across the two metal strips. In some implementations, the alignment thereof can be driven by electrostatic interactions.

FIG. 2G shows an SEM image of Cu nanofiber arrays and patterns with a single set of nanofibers arranged in parallel, consistent with one or more embodiments of the present disclosure. FIG. 2H shows an SEM image of Cu nanofiber arrays and patterns with two sets of nanofibers arranged perpendicular to one another, as also consistent with one or more embodiments of the present disclosure. In such directional nanomaterial systems, the charge carriers transport primarily along the fibers with little junction scattering. The nearly junction-free network with oriented nanofibers can be particularly useful for enhancing the surface conductance in the orientation direction with a shorter conduction path compared with a random network. Moreover, these conductive nanofiber patterns can also be useful for a large-scale, low-cost polarizer and for touch screens.

To evaluate the performance of electrospun Cu nanofiber networks as transparent electrodes, the specular transmittance can be measured. The density of Cu nanofiber networks can be controlled by adjusting the deposition time of the electrospinning process.

Figure 3:
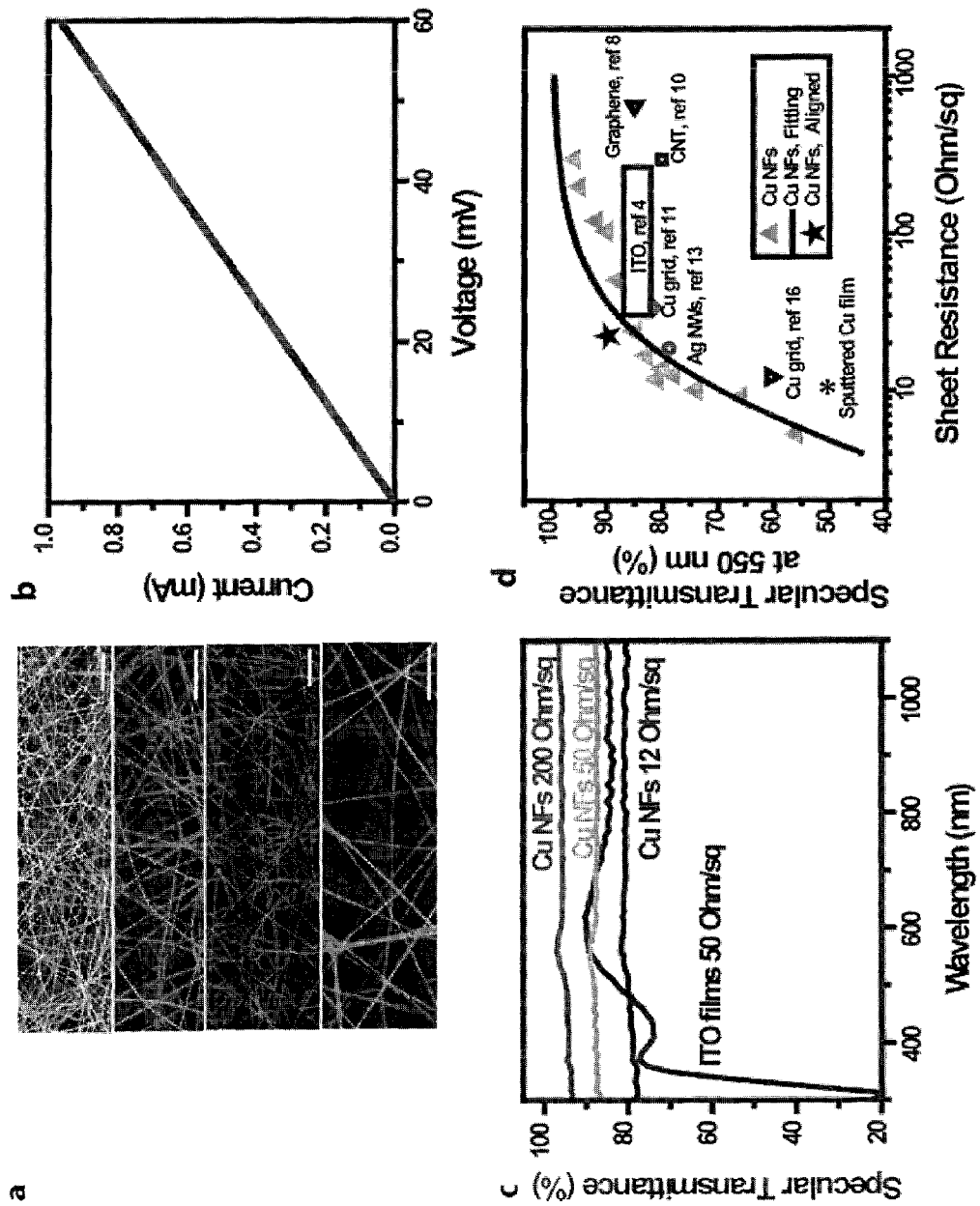
FIG. 3A depicts results showing that changes to the electro spinning time of the Cu nanofiber networks can result in different transparencies, consistent with an embodiment of the present disclosure.
FIG. 3B depicts results showing that the current-voltage curves of the nanofiber network were linear, consistent with an embodiment of the present disclosure.
FIG. 3C shows the specular transmittance spectrum of a Cu nanofiber network, consistent with an embodiment of the present disclosure.
FIG. 3D depicts the performance of transparent Cu nanofiber networks, ITO electrodes, CNT networks and graphene thin films, where specular transmittance is plotted against sheet resistance, consistent with an embodiment of the present disclosure.

FIG. 3A depicts characteristics of various Cu nanofiber networks formed with different electrospinning time to set different transparencies, consistent with another example embodiment of the present disclosure. A 4-probe method can be used in sheet resistance measurements in order to avoid contact resistance between test electrodes and Cu nanofibers.

FIG. 3B depicts a current-voltage curve for a nanofiber network, consistent with another example embodiment of the present disclosure. The linearity indicates Ohmic transport in the transparent Cu nanofiber network. The transparent electrode can be formed with small variations of sheet resistance (e.g., less than 10%).

FIG. 3C shows the specular transmittance spectrum of a Cu nanofiber network, consistent with an embodiment of the present disclosure. The random network of Cu nanofibers shows optical transmittance in the visible and near infrared ranges (300-1100 nm). In various implementations, sheet resistances of 200 Ohm/sq at ~96% transmittance, 50 Ohm/sq at ~90% transmittance, and 12 Ohm/sq at ~80% transmittance are achieved. The density of Cu nanofibers can be increased to decrease sheet resistance, and the transmittance can decrease as the network thickness increases before reaching the effective skin depth of metal network. In this context, tradeoffs between sheet resistance and transmittance can be set to achieve specific transmittance/conductance properties to suit particular applications.

For instance, the resistance/transmittance ratio (R/T) performance with an ITO electrode on plastic can compared to a Cu nanofiber network and used to set resulting values to suit particular applications. As shown in FIG. 3C, the ITO electrode shows a transmittance peak around 500 nm, leading to a yellowish color. The yellowish color of ITO can lead to a high color index value in lab color space, which may necessitate color adjustment components in displays. In some implementations, a Cu nanofiber network exhibits a flat spectrum in the whole measured range from 300 nm to 1100 nm. The flat spectrum, which can remove the need for excess process steps and color adjustment components, can be of particular importance for display applications. For solar cell applications, the transmittance in the near infrared range can be important because a significant amount of the solar energy falls into this region. In some implementations, the flat transmittance spectrum is set and used to facilitate the application of transparent Cu electrodes in solar cells through utilization of the very broad solar spectrum wavelength range.

FIG. 3D depicts performance characteristics for transparent Cu nanofiber networks, ITO electrodes, CNT networks and graphene thin films, where specular transmittance is plotted against sheet resistance, consistent with one or more embodiments of the present disclosure. A figure of merit, defined as $\Phi=T^{10}/R_s$ ($\Omega^{-1}$), can be used to evaluate the performance of the transparent electrodes. Consistent with the data shown in FIG. 3D, the figure of merit is $11\times10^{-3}\Omega^{-1}$ for the Cu nanofiber network, $5\times10^{-3}\Omega^{-1}$ for ITO, $3.6\times10^{-3}\Omega^{-1}$ for CNTs, $0.4\times10^{-3}\Omega^{-1}$ for graphene, $5.6\times10^{-3}\Omega^{-1}$ for Ag nanowire networks, $0.5\times10^{-3}\Omega^{-1}$ for the Cu grid and $0.1\times10^{-3}\Omega^{-1}$ for sputtered Cu films Aligned Cu nanofiber networks increase the figure of merit of the transparent electrode even further. In FIG. 3D, the star indicates aligned cross arrays of Cu nanofibers, which show 90% transmittance at lower sheet resistances of 25 Ohm/sq. In the oriented fiber networks, the resistances in the direction normal to the fibers can be set much higher than those along the fiber directions, such as more than 10,000 times higher. Using this approach, electrospinning processes as discussed here can be used for manufacturing scalable transparent electrodes with anisotropic surface conductance.

Figure 4:
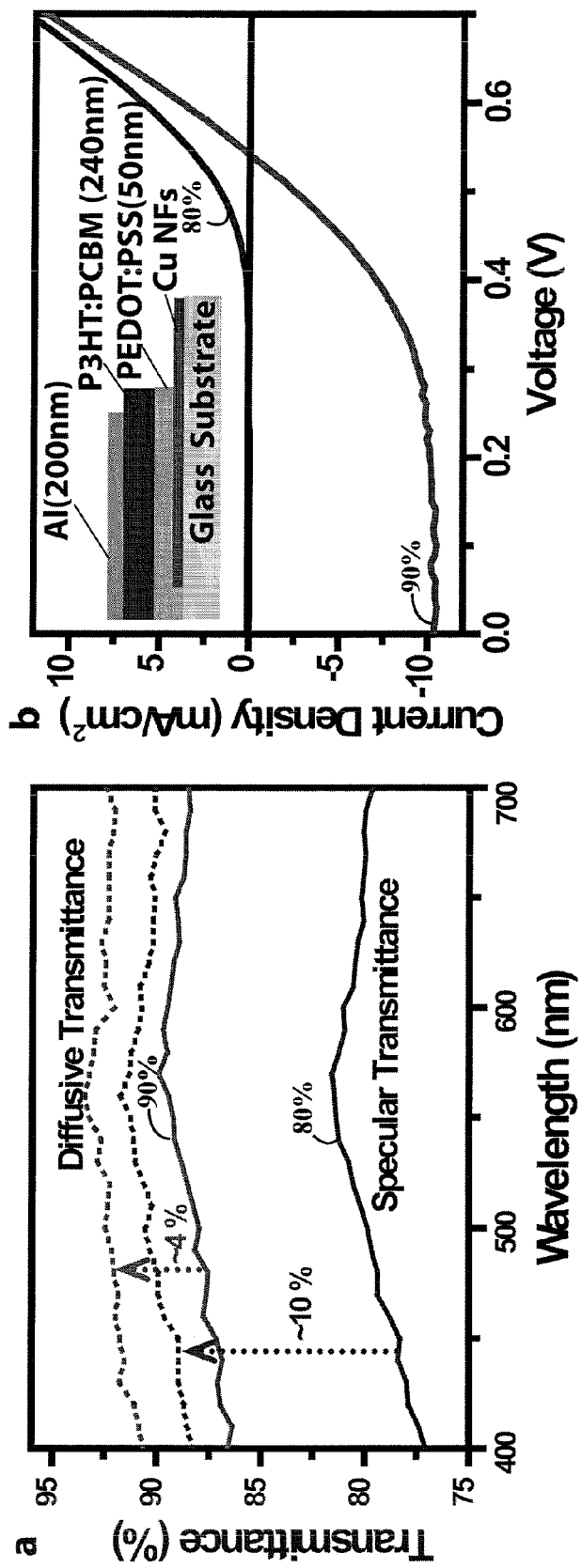
FIG. 4A depicts results of specular and diffuse transmittance, consistent with an embodiment of the present disclosure.
FIG. 4B shows the current-voltage data for an organic solar cell using Cu nanofiber networks as the transparent anode, consistent with an embodiment of the present disclosure.

FIG. 4A depicts specular and diffuse transmittance characteristics for nanofiber networks, consistent with one or more embodiments of the present disclosure. For transparent Cu nanofiber networks used in solar cell applications, the diffusive transmittance can be measured/set instead of specular transmittance. The transparent Cu nanofiber electrodes also show higher diffusive transmittances than specular transmittances. The difference between the diffusive transmittance (dotted lines) and the specular transmittance (solid lines) is shown to be 10% at the ~80% specular transmittance, and 4% at ~90% specular transmittance (FIG. 4A). The dotted arrows indicate the correlation between the results for specular and diffusive transmittance for the same Cu nanofiber network. When diffusive transmittance is used, the figure of merit for the Cu nanofiber network was $23 \times 10^{-3} \Omega^{-1}$. Additionally, the large scattering of the metal nanofibers can effectively increase in the light absorption path length in the active layer, which can be particularly useful for solar cell performance. These characteristics can be used to set, or tune, electrodes for particular applications.

FIG. 4B shows the current-voltage data for an organic solar cell using Cu nanofiber networks as the transparent anode, consistent with another example embodiment of the present disclosure. Example device fabrication and characterization details for the solar cell are discussed in more detail herein. The power conversion efficiency of the device can be set at 3.0%. The figures of merit for the device using a glass/Cu nanofiber substrate are short circuit current ($J_{SC}$) 10.4 mA/cm$^2$, open circuit voltage ($V_{OC}$) 0.55 V and fill factor (FF) 0.53. The FF is partially dependent upon the series resistance ($R_s$), which can be set via the action of sulfonic acid in PEDOT:PSS partially corroding the Cu nanofiber network during spin coating. For the device shown in FIG. 4B, $R_s$ increased from ~35 Ω/sq to ~80 Ω/sq after the deposition of PEDOT:PSS, after which $R_s$ was stable. In certain implementations, the PEDOT:PSS layer can be replaced in organic solar cells, because it is thought to have deleterious effects on the stabilities of organic solar cells. Accordingly, embodiments of the present disclosure relate to control or improvement of power conversion efficiency by replacement of PEDOT:PSS with a non-corrosive layer.

The sheet resistance associated with transport within the PEDOT:PSS layer in the open spaces between the Cu nanofibers, which is typically less than 10 μm even for films that are 90% transparent, can have a negative effect on the power conversion efficiency scales as $R_s w^2$, where w is the relevant length scale, such as the device width or the greatest distance to a Cu nanofiber. In some implementations, these factors can be approximately 1 cm and 10 μm, respectively. Various characteristics of a transparent electrode as discussed herein can be set to address such effects. For these two different length scales, $w^2$ differs by a factor of $10^6$ and thus the sheet resistance requirements of the nanofiber network and the PEDOT:PSS also differ by a factor of $10^6$. The sheet resistance of the PEDOT:PSS layer can be set to $10^5$ Ω/sq, to achieve a sufficiently conductive material for applications thereof. Electrospinning can be used to form a network in which the fibers themselves are smooth and with few, if any, wires that stick up out of the film, which can be used to facilitate the formation of a conformal coating of organic material over wires.

In accordance with various embodiments, Cu nanofibers are formed to exhibit chemical stability against oxidation in air. In connection with an example embodiment, it has been discovered that bare Cu nanofiber networks in air degrade slowly over a long time scale. For example, a Cu nanofiber transparent electrode kept in ambient conditions for 3 months showed a sheet resistance increase from 10Ω to 18Ω due to slow Cu oxidation, but the transparency shows no measurable change. For device applications, where Cu nanofibers are embedded underneath the other materials (e.g., FIG. 4B), the chemical stability of Cu nanofibers is less of a concern. For the applications where Cu nanofibers are exposed to ambient atmosphere, encapsulation can be used to increase long-term stability. For instance, such encapsulation may involve encapsulating a nanofiber in a passivation layer. These approaches can be used to form Cu nanofibers with stability aspects to suit the application.

Due to their large aspect ratios, nanoscale diameters, and metallic bonding natures of Cu nanofibers, the transparent electrodes can be formed with flexibility and stretching properties to suit certain applications. Consistent with one implementation, transparent Cu nanofiber electrodes on Polydimethylsiloxane (PDMS) substrates are fabricated by transferring free-standing CuO nanofiber networks to PDMS. The CuO network on PDMS is heated in an $H_2$ atmosphere at 300° C. to transform into Cu. In various implementations, metal nanostructured films as discussed herein are transferred from one substrate to another using a PDMS stamp.

Figure 5:
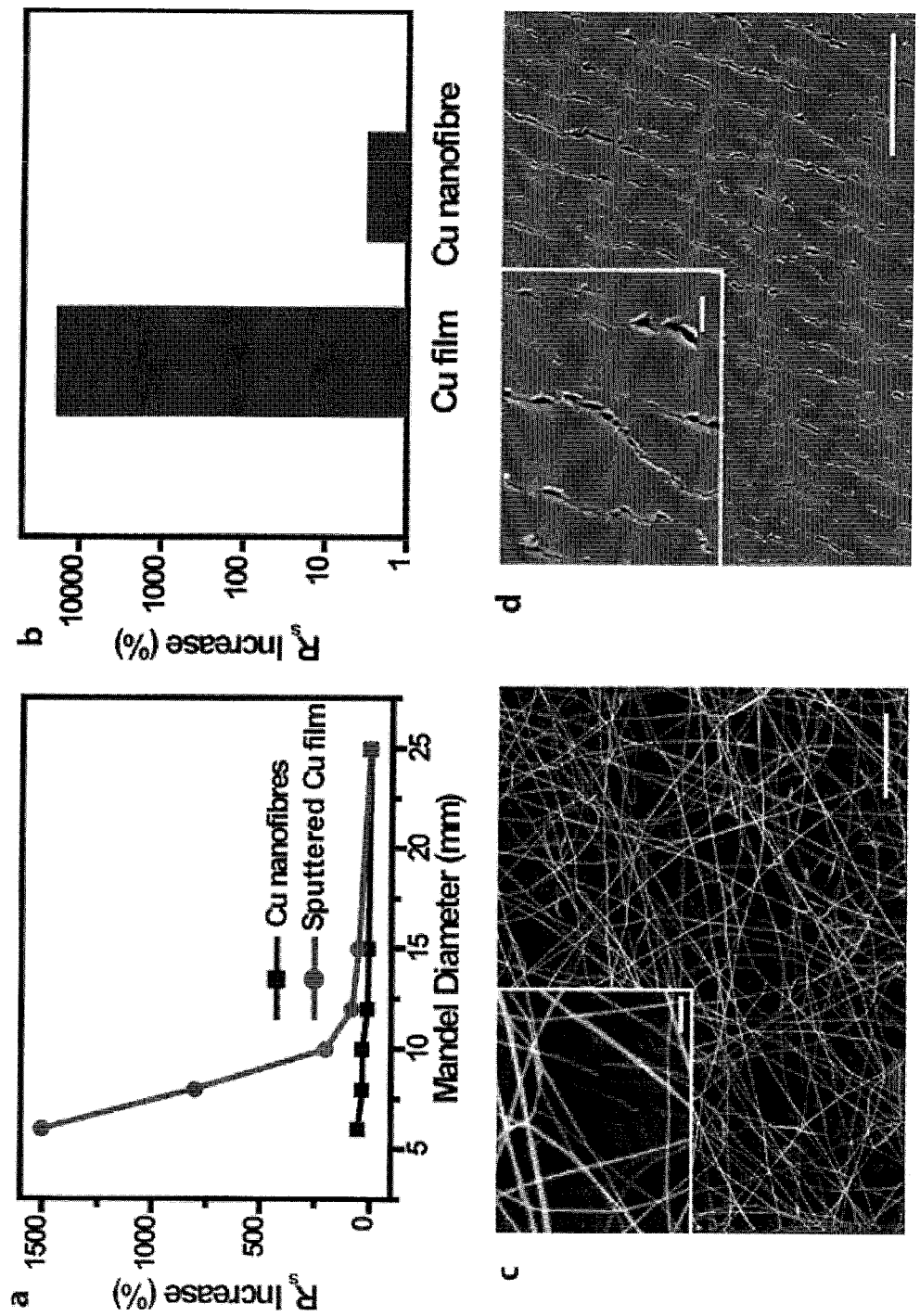
FIG. 5A shows the flexibility that was exhibited by the Cu electrode, consistent with an embodiment of the present disclosure.
FIG. 5B shows the comparison of the relative changes of the resistance for Cu thin films (~50 nm thick) and Cu nanofiber network after the mechanical stretch test with 10% strain, consistent with an embodiment of the present disclosure.
FIG. 5C is an SEM image depicting the film morphologies after the bending test for Cu nanofiber networks, consistent with an embodiment of the present disclosure.
FIG. 5D is an SEM image depicting the film morphologies after the bending test for Cu thin films on PDMS, consistent with an embodiment of the present disclosure.

The inset of FIG. 5A shows flexibility characteristics of a Cu electrode, consistent with another embodiment of the present disclosure. The Cu electrode is formed to withstand bending to an about 6 mm radius of curvature with little sheet conductance degradation.

FIGS. 5C and 5D are SEM images depicting the film morphologies after the bending test for Cu nanofiber networks and Cu thin films on PDMS, respectively, consistent with another embodiment of the present disclosure. Cu nanofibers maintain their 1D structures, which can be facilitated using their large aspect ratios and small diameters, while Cu films form many cracks with gaps of ~50 nm.

FIG. 5B shows the comparison of the relative changes of the resistance for Cu thin films (~50 nm thick) and Cu nanofiber network after a mechanical stretch test with 10% strain, for a sheet electrode consistent with an embodiment of the present disclosure. The flexibilities and stretchabilities for Cu nanofiber networks in the sheet electrode can be particularly useful for emerging flexible or/and stretchable electronics, to suit particular applications.

In some embodiments, devices as discussed herein are produced using an electrospinning process as follows. PVA (Mw=42 000 g mol$^{-1}$, Aldrich) is dissolved in distilled water at a concentration of 10 wt %. Copper acetate (Aldrich) is then added into the solution at a concentration of 10 wt %. The mixture is stirred and ultrasonically agitated for 24 h to form homogeneous solutions for electrospinning. The PVA/CuAc$_2$ blended solution is loaded in a 1 mL plastic syringe attached to a syringe pump (KDS200, KD Scientific Inc.) which provides a steady solution flow rate of 0.2 mL/h during electrospinning. A high-voltage power supply (Gamma High Voltage Research) is employed to generate a high potential of 15 kV to a 21 gauge blunt-end syringe needle. The electrospun nanofibers are collected onto a glass slide on grounded aluminum foil, which are horizontally and perpendicularly placed 12 cm away from the spinneret. The nanofiber-coated glass slides are heated in air at 500° C. for 2 hours at a heating rate of 5° C./min. Subsequent annealing is performed at 300° C. in an $H_2$ atmosphere for half an hour in a tube furnace, with a heating rate of 2° C./min. The $H_2$ gas pressure and flow rate are 40 Torr and 200 sccm/min, respectively. After hydrogen reduction, transparent Cu nanofiber thin films are fabricated on glass substrates.

Solar cell devices can be produced as follows, in accordance with one or more example embodiments. Poly-3-hexylthiophene (P3HT):[6,6]-phenyl-C61-butyric acid (PCBM) solar cells are fabricated while taking care to reduce/minimize unnecessary air exposure to Cu nanofiber substrates. Briefly, a 50 nm layer of PEDOT:PSS (Clevios PH 500) is formed by depositing a single drop on a sample spinning at 4000 rpm in air. The sample is then transferred to a nitrogen-filled glove box and annealed at 110° C. for 10 minutes. The active layer (P3HT:PCBM1:1 weight ratio, 25 mg/mL in dichlorobenzene, film thickness: ~240 nm) and metal electrode (7 nm Ca/200 nm Al) deposition and device testing are performed inside a nitrogen glove box.

Device and/or electrode properties are confirmed as follows, in accordance with another example embodiment. Nanofibers are characterized using SEM (FEI XL30 Sirion, with an accelerating voltage of 15 kV), TEM and EDS (FEI Tecnai G2 F20 X-TWIN with EDS, operating at an accelerating voltage of 200 kV), and wide-angle X-ray analysis (PANalytical X'Pert PRO x-ray diffraction system). Standard hemispherical measurements are carried out for transmittance measurement with an integrating sphere (Newport), a xenon lamp coupled with a monochromator. An (about) identical glass substrate is used as the reference in the measurement. The electrical properties measurement of Cu fiber films are carried out on an analyzer such as an Agilent B1500A semiconductor device analyzer. The sheet resistances are measured by a four-terminal configuration to remove the contact resistances. Each stripe-shaped contact is made by conductive silver paint (Silver Print II, GC Electronics), which has an Ohmic contact resistance less than 1 Ohm. To obtain the sheet resistance, four-terminal I-V measurements are conducted by applying a known current between the two outermost contacts and monitoring the voltage drop between the two inner contacts.

Figure 6:
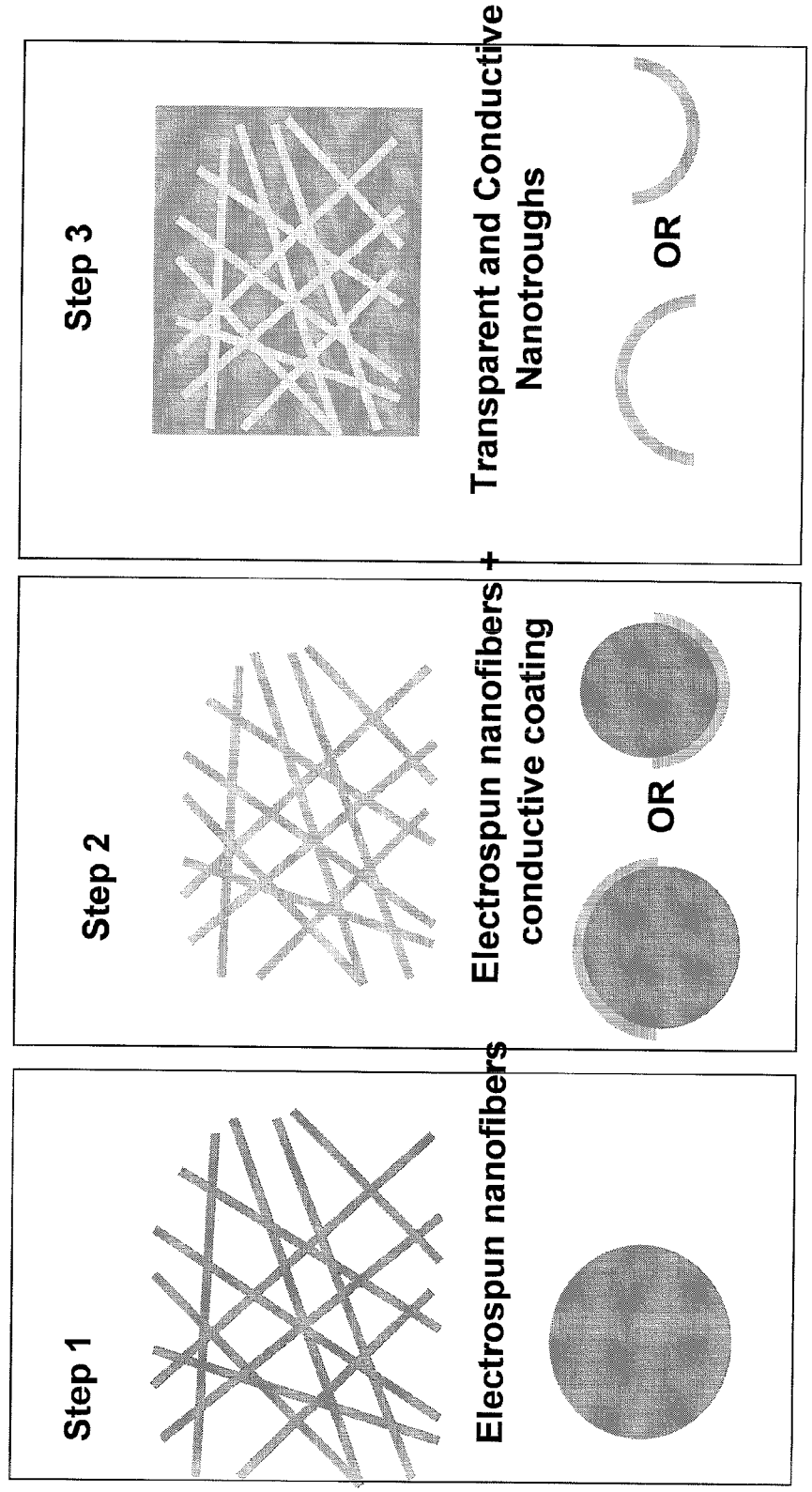
FIG. 6 depicts a process for producing nanofiber networks having nanofibers configured as troughs, consistent with an embodiment of the present disclosure.

FIG. 6 depicts a process for producing nanofiber networks having nanofibers configured as troughs, consistent with an embodiment of the present disclosure. The troughs manifest as long depressions formed by sidewalls of the nanofibers. The process is implemented by first electrospinning freestanding polymer nanofiber webs. A conductive layer is then applied to the polymer nanofibers. This application can be implemented using a number of different techniques including, but not limited to, thermal evaporation, sputtering and electrolysis deposition. If desired, polymer nanofibers can then be removed. This can be accomplished, for example, by dissolving in solvent or by heating.

Figure 7:
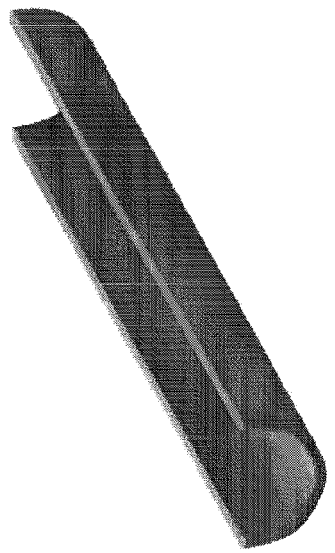
FIG. 7 depicts a trough-based structure, consistent with an embodiment of the present disclosure.
Figure 7:
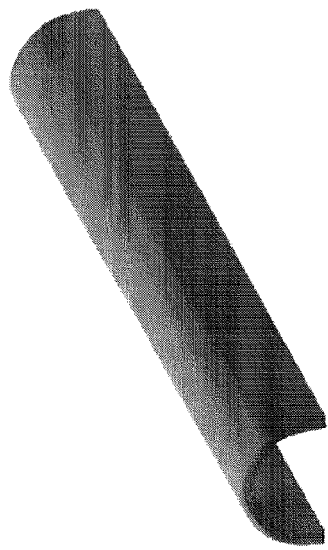

FIG. 7 depicts a trough-based structure, consistent with an embodiment of the present disclosure. The depicted nanofibers are shown as elongated structures with sidewalls that create a hollow depression therebetween.

Figure 8B:
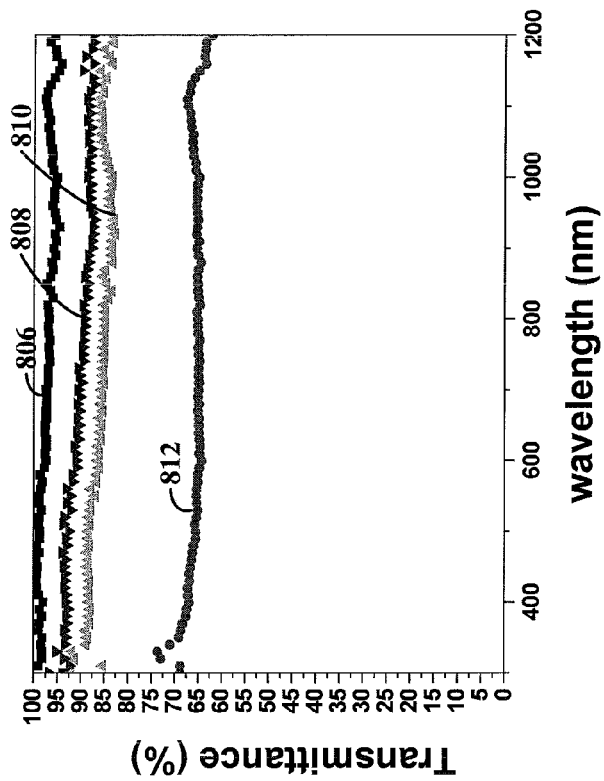
FIG. 8B depicts results for nanofiber networks having nanofibers configured as troughs, consistent with an embodiment of the present disclosure.
Figure 8A:
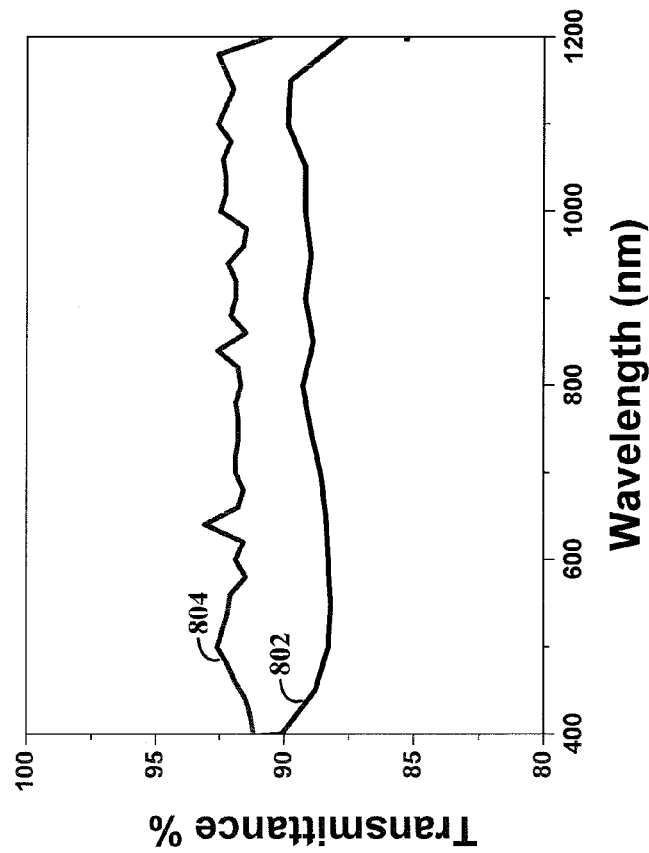
FIG. 8A depicts results for nanofiber networks having nanofibers configured as troughs, consistent with an embodiment of the present disclosure.

FIG. 8A depicts characteristics of nanofiber networks having nanofibers configured as troughs, consistent with an embodiment of the present disclosure. Line 802 depicts transmittance vs. wavelength for a nanofiber network in which the polymer nanofiber webs are still present. Line 804 depicts transmittance vs. wavelength for a nanofiber network in which the polymer nanofiber webs were dissolved.

FIG. 8B depicts characteristics of nanofiber networks having nanofibers configured as troughs, consistent with an embodiment of the present disclosure. Line 806 depicts transmittance vs. wavelength for a nanofiber network having a sheet resistance of 160 Ohm/sq. Line 808 depicts transmittance vs. wavelength for a nanofiber network having a sheet resistance of 62 Ohm/sq. Line 810 depicts transmittance vs. wavelength for a nanofiber network having a sheet resistance of 26 Ohm/sq. Line 812 depicts transmittance vs. wavelength for a nanofiber network having a sheet resistance of 1.7 Ohm/sq.

Figure 9:
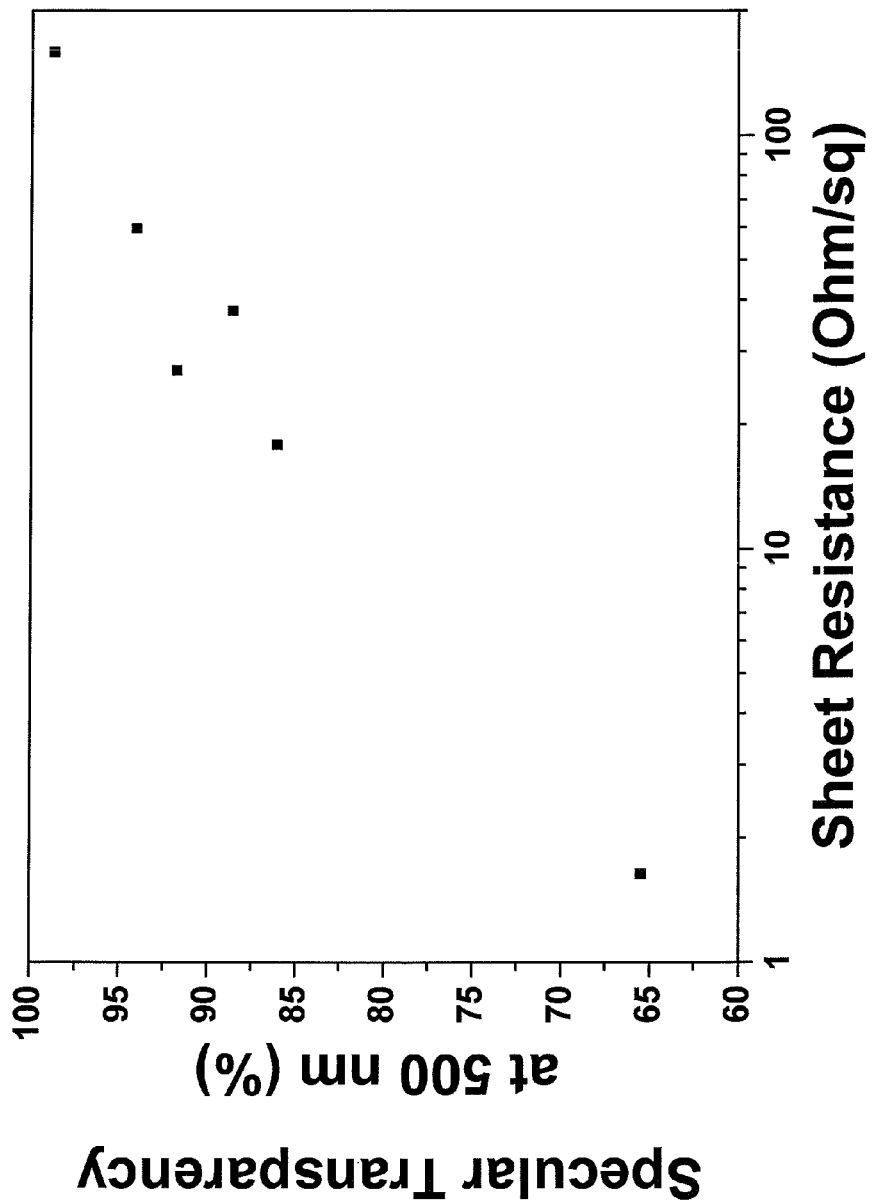
FIG. 9 depicts results for nanofiber networks having nanofibers configured as troughs, consistent with an embodiment of the present disclosure.

FIG. 9 depicts characteristics of nanofiber networks having nanofibers configured as troughs, consistent with an embodiment of the present disclosure. Transmittance vs. sheet resistance characteristics are shown at a wavelength of about 500 nm.

As discussed above, specific applications and background details relative to the present disclosure are discussed above, in the description below and throughout the references cited herein. The embodiments in the above-referenced provisional application (including the Appendix document that formed part of the application) may also be implemented in connection with one or more of the above-described embodiments and implementations, as well as with those shown in the figures and described herein.

It will be understood by those skilled in the relevant art that the above-described implementations are exemplary, and many changes can be made without departing from the true spirit and scope of the present disclosure. Such changes may include, for example, combining or separating various embodiments as discussed herein, or using nanostructures of different shape and/or composition (e.g., between 0-360 degree cross sections, metal tube structures, conductive polymer cores, or removed-core structures, or core-shell structures). Therefore, it is not intended by the appended claims to cover all such changes and modifications that come within the true spirit and scope of this disclosure.

What is claimed is:

1. An apparatus comprising:
   at least two circuit nodes; and
   a conductive material configured and arranged to electrically couple said at least two circuit nodes, the conductive material including a network of elongated portions of at least one electrospun Cu-based nanostructure for an article that provides conductive and transparent attributes, each of the elongated portions having the conductive and transparent attributes being provided by an aspect ratio of at least 50,000 and a length that is greater than 100 microns, and
   at least one fused crossing point joining with a fused crossing point of another of the elongated portions, the network of elongated portions being distributed and aligned in the conductive material to set a conductance level and a transparency level along the network in at least one direction.

2. An apparatus according to claim 1, wherein the elongated portions are distributed and aligned in the conductive material to provide an electrospun Cu-based optical elongated fiber, with a preponderance of the elongated portions being aligned with the length of the elongated fiber.

3. An apparatus according to claim 1, wherein the elongated portions are arranged pseudo-randomly and wherein said at least one direction of the conductive material defines a thickness thereof.

4. An apparatus according to claim 3, further including a solar panel having two circuit nodes coupled across a light-collecting portion of the solar panel, wherein the conductive material is configured and arranged to electrically couple the two circuit nodes.

5. An apparatus according to claim 1, wherein the elongated portions form a network of elongated portions extending in first and second directions defining a cross sectional layout of the apparatus, the conductivity of the network in the first being higher than the conductivity of the network in the second direction, to provide conductivity in the first direction and resistance in the second direction.

6. An apparatus according to claim 1, wherein the elongated portions form a network of elongated portions extending in first and second directions defining a cross sectional layout of the apparatus, the conductivity of the network in the first direction being about equal to the conductivity of the network in the second direction.

7. An apparatus according to claim 1, wherein at least one of the elongated portions has an aspect ratio of at least 100,000.

8. An apparatus according to claim 1, wherein at least one of the elongated portions is continuous for more than 1 cm.

9. An apparatus according to claim 1, wherein the network is configured and arranged to change an optical polarization of light passing through the network.

10. An apparatus according to claim 1, wherein the network is configured and arranged to provide a flat spectrum of light having wavelengths between 300 nm and 100 nm.

11. An apparatus according to claim 1, wherein the network is configured and arranged to specularly transmit incident light.

12. An apparatus according to claim 1, wherein the network is configured and arranged to diffusively transmit incident light.

13. An apparatus according to claim 1, wherein the each of the joined fused crossing points is configured and arranged with the thickness of the elongated portions joined via the fused crossing point that is within about 10% of the thickness of one of the elongated portions.

14. An apparatus according to claim 1, wherein each Cu-based nanostructure is continuous, one-dimensional and aligned along a length with others of the nanostructures, the nanostructures being configured and arranged to provide conductivity in a direction along the length that is greater than a conductivity of the network in a direction normal to the length, to provide resistance in the direction normal to the length.

15. An apparatus according to claim 1, wherein a figure of merit ($\Phi$) for the apparatus is defined as $\Phi=T^{10}/R_s$ ($\Omega^{-1}$), in which T is transmittance and Rs is sheet resistance of the network, and $\Phi$ is at least $10 \times 10^{-3} \Omega^{-1}$.

16. An apparatus according to claim 1, wherein the at least one fused crossing point exhibits a junction resistance and thickness, relative to a diameter of the elongated portions fused at the fused crossing point, that is sufficiently low for the the conductive material to provide at least 90% transmittance and a sheet resistance of less than 50 Ohm/sq.

17. An apparatus according to claim 1, wherein said at least one electrospun Cu-based nanostructure has fused crossing points at locations along the electrically spun Cu-based nanostructure that set the conductance level of the conductive material, has different portions thereof arranged to correspond to other portions, and has respective portions arranged with random charecteristics.

18. An apparatus according to claim 1, wherein the network of elongated portions includes respective sets of the elongated portions, different ones of the sets exhibiting different conductance and transmittance values relative to other ones of the sets.

19. An apparatus according to claim 1, wherein the network of elongated portions includes respective sets of the elongated portions that extend between said at least two circuit nodes, the respective sets including alternating first and second sets of elongated portions, the first set exhibiting high-optical transmittance relative to the second set, and the second set exhibiting high conductivity relative to the first set.

20. A photonic conductive sheet comprising:
a plurality of elongated portions respectively having at least one electrospun Cu-based nanostructure, each elongated portion having an aspect ratio of at least 50,000 and a length that is greater than 100 microns; and
a plurality of fused crossing points, each fused crossing point being connected to one of the elongated portions and joined with another one of the fused crossing points that is connected to another one of the elongated portions, the fused crossing points joining the elongated portions in a sheet network extending in first and second directions, the network having a transmittance of at least 90% and a sheet resistance of less than 50 Ohm/sq, each fused crossing point including portions of each of the elongated portions connected by the fused crossing point and having a thickness that is about equal to the thickness of one of the elongated portions connected by the fused crossing point.

21. A method for manufacturing an apparatus, the method comprising:
forming a conductive material between at least two circuit nodes and electrically coupling said at least two circuit nodes with the conductive material, the conductive material having a network of elongated portions of at least one electrospun Cu-based nanostructure for an article that provides conductive and transparent attributes, each of the elongated portions having the conductive and transparent attributes set by
forming the elongated portions with an aspect ratio of at least 50,000 and a length that is greater than 100 microns, and
forming at least one fused crossing point joining with a fused crossing point of another of the elongated portions, the network of elongated portions being distributed and aligned in the conductive material to set a conductance level and a transparency level along the network in at least one direction.

22. The method of claim 21, wherein forming the elongated portions includes distributing and aligning the elongated portions in the conductive material to provide an electrospun Cu-based optical elongated fiber, with a preponderance of the elongated portions being aligned with the length of the elongated fiber.

23. The method of claim 21, wherein
forming the elongated portions includes pseudo-randomly arranging the elongated portions extending in first and second directions to define a cross sectional layout of the apparatus, and
forming at least one fused crossing point includes forming fused crossing points to set the conductance and transparency levels in a direction that corresponds to a thickness of the conductive material that is about orthogonal to the first and second directions.

24. The method of claim 21, wherein forming the elongated portions includes forming a network of the elongated portions extending in first and second directions defining a cross sectional layout of the apparatus, the conductivity of the network in the first direction being higher than the conductivity of the network in the second direction.

25. The method of claim 21, wherein forming the elongated portions includes forming a network of elongated portions extending in first and second dierections defining a cross sectional layout of the apparatus, the conductivity of the network in the first direction being about equal to the conductivity of the network in the second direction.

26. The method of claim 21, wherein forming the at least one fused crossing point includes forming a plurality of fused crossing points joining the elongated portions, each of the fused crossing points having a junction resistance that is sufficiently low for the conductive material to provide 90% transmittance and a sheet resistance of about 50 Ohm/sq.

27. The method of claim 21, wherein forming the elongated portions includes
- forming an elongated core material,
- coating the core material, and
- removing the core material, leaving the coating behind and electrically connecting the at least two circuit nodes.

28. The method of claim 21, wherein forming the elongated portions includes electrospinning precursor nanofibers and processing the precursor nanofibers to form the elongated portions.

29. The method of claim 21, wherein forming a conductive material includes forming a touch-screen circuit having networks of elongated portions extending laterally across the touch-screen circuit, the network of elongated portions being configured and arranged with a transmittance of at least about 90% and to provide an output indicative of a change in resistance of a portion of the touch-screen circuit responsive to a touch interaction between the circuit and an object.

* * * * *

UNITED STATES PATENT AND TRADEMARK OFFICE
CERTIFICATE OF CORRECTION

PATENT NO. : 8,940,194 B2  
APPLICATION NO. : 13/214570  
DATED : January 27, 2015  
INVENTOR(S) : Cul et al.

Page 1 of 1

It is certified that error appears in the above-identified patent and that said Letters Patent is hereby corrected as shown below:

In the Claims

Col. 14, line 59, Claim 5: "first being" should read --first direction being--.

Col. 15, line 20, Claim 13: "with the thickness" should read --with a thickness--.

Col. 15, line 39, Claim 16: "the the conductive" should read --the conductive--.

Col. 15, line 47, Claim 17: "charecteristics" should read --characteristics--.

Col. 16, line 57, Claim 25: "dierections" should read --directions--.

Signed and Sealed this  
Sixteenth Day of August, 2016

Michelle K. Lee  
*Director of the United States Patent and Trademark Office*